United States Patent [19]
Lee et al.

[11] Patent Number: 5,798,291
[45] Date of Patent: Aug. 25, 1998

[54] METHOD OF MAKING A SEMICONDUCTOR DEVICE WITH RECESSED SOURCE AND DRAIN

[75] Inventors: Joon Sung Lee; Won Young Jung, both of Seoul, Rep. of Korea

[73] Assignee: LG Semicon Co., Ltd., Chungcheongbuk-do, Rep. of Korea

[21] Appl. No.: 831,343

[22] Filed: Apr. 1, 1997

Related U.S. Application Data

[63] Continuation-in-part of Ser. No. 406,710, Mar. 20, 1995, abandoned.

[51] Int. Cl.$^6$ ................................................ H01L 21/336
[52] U.S. Cl. ........................ 438/301; 438/307; 438/303; 438/308
[58] Field of Search ........................ 437/41 SM, 44; 438/301, 303, 307, 308

[56] References Cited

U.S. PATENT DOCUMENTS

| | | | |
|---|---|---|---|
| Re. 30,251 | 4/1980 | Kooi | 438/301 |
| 4,043,848 | 8/1977 | Bazin | 438/301 |
| 4,069,577 | 1/1978 | Dingwall | 438/301 |
| 4,113,533 | 9/1978 | Okumura et al. | 438/301 |
| 4,939,100 | 7/1990 | Jeuch et al. | 437/44 |
| 4,963,502 | 10/1990 | Teng et al. | 437/41 |
| 5,012,306 | 4/1991 | Tasch, Jr. et al. | 357/23.4 |
| 5,043,778 | 8/1991 | Teng et al. | 357/23.3 |
| 5,084,418 | 1/1992 | Esquivel et al. | 438/301 |
| 5,218,221 | 6/1993 | Okumura | 257/336 |
| 5,270,257 | 12/1993 | Shin | 437/203 |
| 5,382,534 | 1/1995 | Sheu et al. | 437/35 |
| 5,393,704 | 2/1995 | Huang et al. | 437/41 SM |
| 5,491,099 | 2/1996 | Hsu | 437/35 |
| 5,538,909 | 7/1996 | Hsu | 438/301 |
| 5,620,912 | 4/1997 | Hwang et al. | 438/303 |

FOREIGN PATENT DOCUMENTS

| | | | |
|---|---|---|---|
| 0046071 | 3/1985 | Japan | 437/44 |
| 1181566 | 7/1989 | Japan | 437/44 |
| 0046275 | 2/1991 | Japan | 437/44 |

*Primary Examiner*—Charles L. Bowers, Jr.
*Assistant Examiner*—Lynne A. Gurley
*Attorney, Agent, or Firm*—Finnegan, Henderson, Farabow, Garrett & Dunner, L.L.P.

[57] ABSTRACT

This invention relates to a semiconductor device and method for fabricating the semiconductor device, for forming a source and drain structure having no side diffusion. The semiconductor device includes a silicon substrate, a gate formed on the silicon substrate with a gate insulation film in between, and a source and drain formed of conductive material layers buried in the substrate to a designated depth at opposite sides of the gate, thereby providing a source with no side diffusion, preventing reduction of channel length, and improving element integration.

5 Claims, 6 Drawing Sheets

5,798,291

METHOD OF MAKING A SEMICONDUCTOR DEVICE WITH RECESSED SOURCE AND DRAIN

This application is a continuation-in-part of application Ser. No. 08/406,710, filed Mar. 20, 1995, now abandoned.

BACKGROUND OF THE INVENTION

1. Field of the Invention

This invention relates to a semiconductor device and method for fabricating the semiconductor device, and, more particularly to a MOSFET (Metal oxide semiconductor field effect transistor) provided with a source and drain structure having no side diffusion.

2. Description of the Related Art

In a MOSFET, a source and drain are used for extracting electrons or holes passing through a channel into a transmission line, or for injecting carriers from the transmission line into the channel. Self-alignment is one of a series of processes for forming sources and drains using ion implantation. Self-alignment, in which a polysilicon gate is used as a blocking layer, improves integration and efficiency. FIGS. 1A–1D show a method for fabricating a MOSFET using self-alignment.

Oxide film 2 and nitride film 3 are successively formed on p type silicon substrate 1 as shown in FIG. 1A. An element separation region is defined with a photoetching process using photoresist 4, and then subjected to chemical stop injection as shown in FIG. 1B.

A field oxidation process, forming field oxide film 5, is followed by removal of nitride film 3 and deposition of polysilicon for forming a gate electrode 6. The polysilicon is patterned to form gate electrode 6 as shown in FIG. 1C.

Next, as shown in FIG. 1D, n type impurity ions are injected using gate electrode 6 as a mask to form source and drain 7 in the substrate on opposite sides of gate electrode 6.

The self-alignment process cannot prevent injected impurity ions from being diffused into the sides of the channel under gate electrode 6 during a subsequent heat treatment process. Thus, an element fabricated with self-alignment limits integration; causes reductions in threshold voltage, punchthrough voltage, and breakdown voltage of the element due to reduced channel length; is liable to short channel effects, such as hot carrier effects; and experiences degradation of operation characteristics. One attempt to minimize problems caused by side diffusion is a Lightly Doped Drain (LDD) structure as shown in FIGS. 2A–2F.

Gate oxide film 2 and polysilicon layer 6 are formed on p type silicon substrate 1 as shown in FIG. 2A. After patterning, polysilicon layer 6 and gate oxide film 2 are used as a mask during low density ion injection of n type impurities, as shown in FIG. 2B.

Side wall spacers 8a on opposite sides of gate 6 as shown in FIG. 2D are created by forming an insulation film 8 on the substrate as shown in FIG. 2C, and etching back the insulation film. N type impurities are injected at high density as shown in FIG. 2E, and the side wall spacers 8a are removed as shown in FIG. 2F. Thus, a source and drain 9 of an LDD structure can be made having low density impurity regions and high density impurity regions.

Fabrication of the foregoing LDD MOSFET is complicated due to required additional process steps, such as insulation film deposition, etch back for side wall spacer formation, and additional ion injection.

SUMMARY OF THE INVENTION

An object of this invention is to solve the foregoing problems, and to provide an MOSFET structure with a source and drain having no side diffusion, and to provide a method for fabricating the same.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the semiconductor device of this invention comprises a silicon substrate; a gate formed on the silicon substrate with a gate insulation film between the gate electrode and the substrate; and a source and drain, each formed of a conductive material deposited to a designated depth in the substrate at opposite sides of the gate.

Additionally, to achieve the objects and in accordance with the purpose of the invention, as embodied and broadly described herein, this invention also provides a method for fabricating a semiconductor device comprising the steps of successively forming on a silicon substrate, a gate insulation film and a conductive layer; patterning the conductive layer and the gate insulation film with a gate pattern to form a gate; etching, to a designated depth, exposed silicon substrate parts at opposite sides of the gate; forming an oxide film on the gate and the silicon substrate by thermal oxidation process; etching the oxide film formed on the etched silicon substrate parts; depositing a conductive material layer on the substrate; and etching the conductive material layer to leave the conductive material layer in the etched silicon substrate parts to form a source and drain.

BRIEF DESCRIPTION OF THE DRAWINGS

The accompanying drawings, which are incorporated in and constitute a part of this specification, illustrate embodiments of the invention, and, together with the description, serve to explain the objects, advantages, and principles of the invention.

In the drawings.

DETAILED DESCRIPTION OF THE INVENTION

Figure 1A:
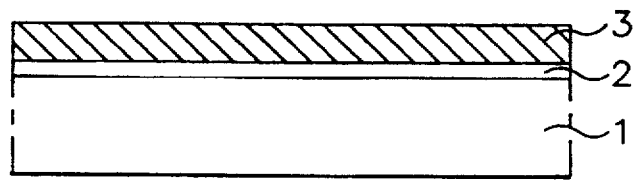
FIGS. 1A–1D show conventional processes for fabricating a MOSFET with a self-alignment process.
Figure 1B:
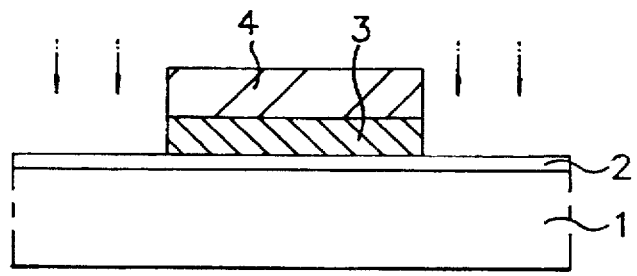
Figure 1C:
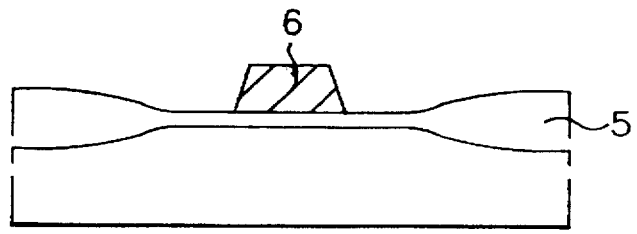
Figure 1D:
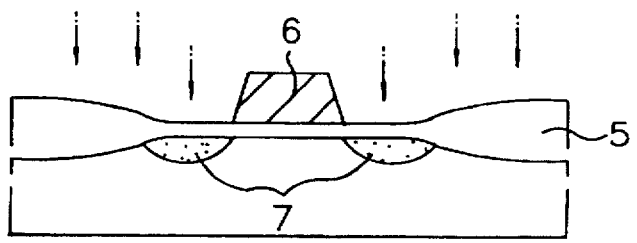
Figure 2A:
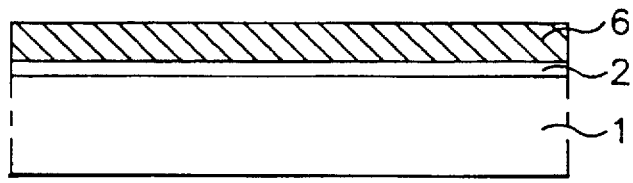
FIGS. 2A–2F show conventional processes for fabricating a MOSFET having an LDD structure.
Figure 2B:
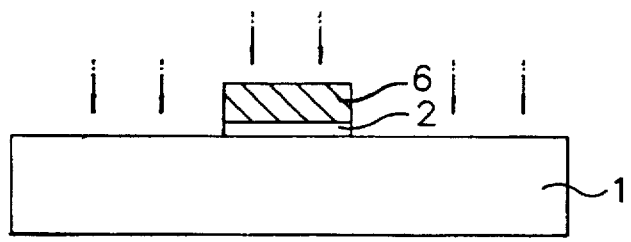
Figure 2C:
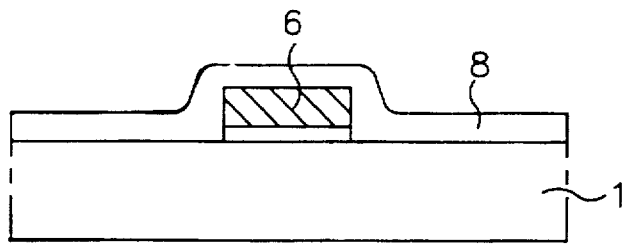
Figure 2D:
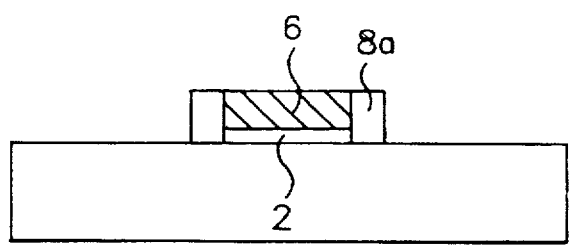
Figure 2E:
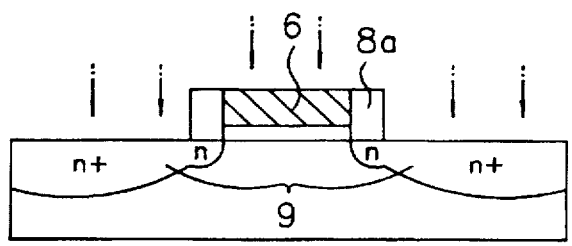
Figure 2F:
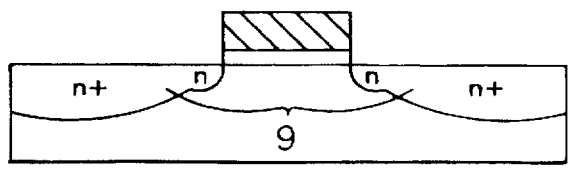

A detailed description of the preferred embodiments of the present invention will be presented below. Wherever possible, the same reference characters will be used to indicate similar structure throughout the drawings.

Figure 3:
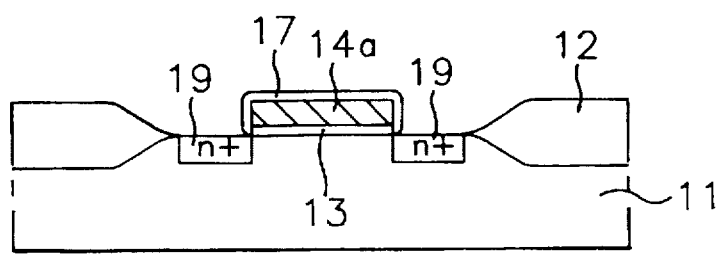
FIG. 3 is a section of a MOSFET in accordance with one embodiment of this invention.

FIG. 3 is a section of a MOSFET in accordance with one embodiment of this invention.

As shown in FIG. 3, a MOSFET in accordance with this invention includes gate electrode 14a formed on silicon substrate 11 with gate insulation film 13 between gate electrode 14a and substrate 11. Source and drain 19, formed of conductive material buried in the substrate to a designated depth, are on opposite sides of gate electrode 14a, and insulation film 17 is on gate electrode 14a for preventing short circuits of gate 14a with source and drain 19.

Source and drain 19 can be, for example, n+ polysilicon (if substrate 11 is p type), and insulation film 17 can be formed by thermal oxidation.

Source and drain 19 can be formed by etching substrate 11 on opposite sides of gate electrode 14a to a designated depth and burying conductive material into the etched areas.

Figure 4:
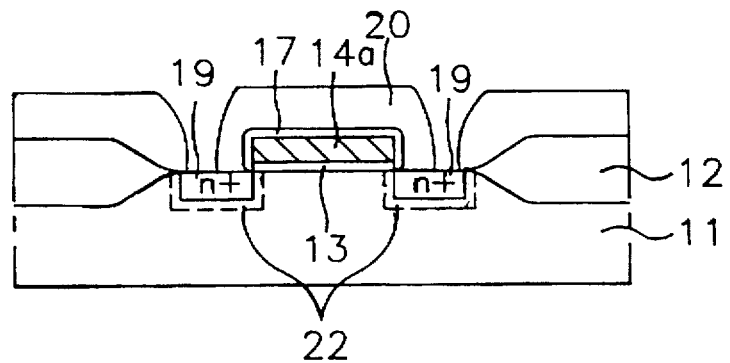
FIG. 4 is a section of an MOSFET in accordance with another embodiment of this invention.

FIG. 4 is a section of a MOSFET in accordance with another embodiment of this invention. According to this embodiment, an LDD structure has low density impurity regions 22, for example n-regions formed around source and drain 19, having a lower density than source and drain 19. Low density impurity regions 22 can be formed without any additional processes, such as side wall spacer forming followed by ion injection as in the conventional processes. Source and drain 19 are then heat treated to diffuse impurities of the conductive layer of the source and drain 19 into the substrate to form low density impurity regions 22.

Source and drain 19 may be made of materials other than n+ polysilicon depending on the density of the channel. In general, if channel density is below $5.0\times10^{17}/cm^2$, n+ polysilicon or p+ polysilicon can be used and when channel density is over $5.0\times10^{17}/cm^2$, Al for nMOS, and W, Mo, Co, and Pt for pMOS can be used.

A MOSFET according to this invention forms source and drain 19 by burying conductive material in substrate 11, not by injecting impurity ions into designated parts of substrate 11. The buried conductive material provides a sufficient difference of work function between the silicon of substrate 11 and the conductive material forming source and drain 19.

Deposition of a conductive material to form source and drain 19 prevents reduction of channel length due to side diffusion, as in the conventional processes, and solves various problems resulting from side diffusion.

A method for fabricating a MOSFET according to this invention will now be explained with reference to FIGS. 5A–5I.

Figure 5A:
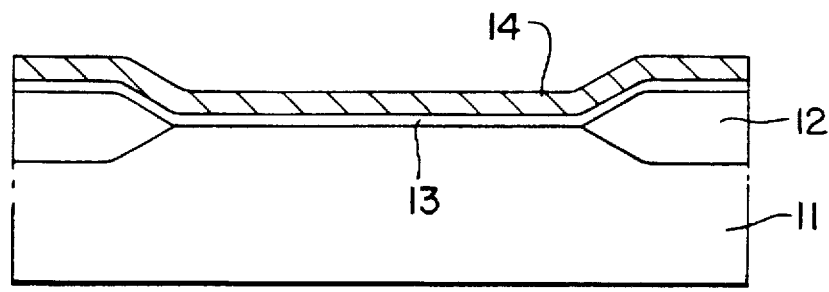
FIGS. 5A–5I show processes for fabricating a MOSFET in accordance with this invention.

As shown in FIG. 5A, field oxide film 12 is formed on a p type silicon substrate 11. A gate insulating film 13 is formed of a thin oxide over P type silicon substrate 11 and field oxide film 12. A gate electrode layer 14 is formed as a layer on gate insulating film 13 by depositing an n+ polysilicon.

Figure 5B:
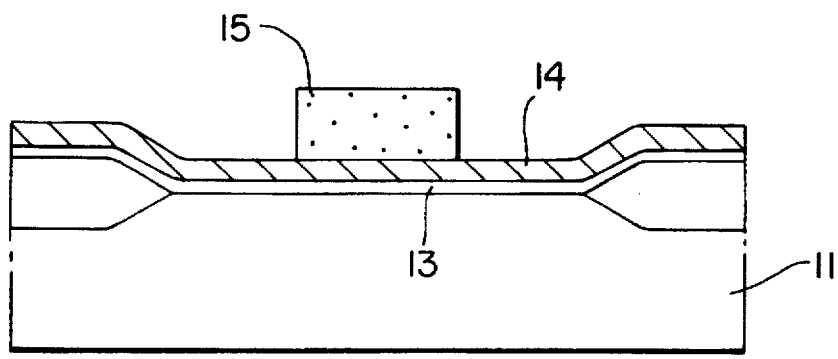

Next, as shown in FIG. 5B, a photoresist 15 is formed on the gate electrode layer 14. Using a mask forming a photoresist 15 is subjected to selective exposure and development to form a gate pattern.

Figure 5C:
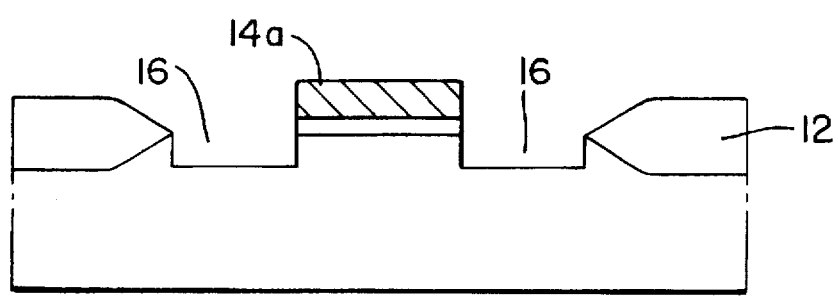

As shown in FIG. 5C gate electrode 14a is etched to form a gate electrode 14a using photoresist 15 as a mask. Gate insulating film 13 is etched to expose silicon substrate 11 on both sides of the gate electrode 14a, which are then etched to a predetermined depth to form recesses 16 as shown in FIG. 5C. Photoresist 15 is subsequently removed. Photoresist 15 protects gate electrode 14a from damage during etching of the gate insulating film 13 and silicon substrate 11.

Figure 5D:
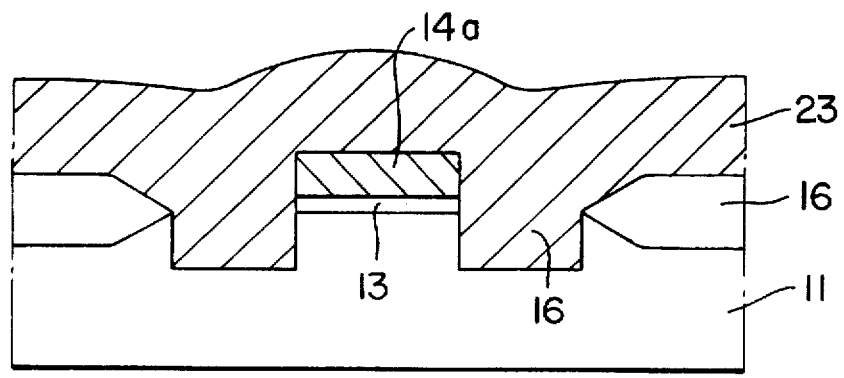

As shown in FIG. 5D, a nitride film 23 is deposited on silicon substrate 11, including gate electrode 14a, to fill recesses 16. A thickness of nitride film 23 is at least half of the width of a recess 16.

Figure 5E:
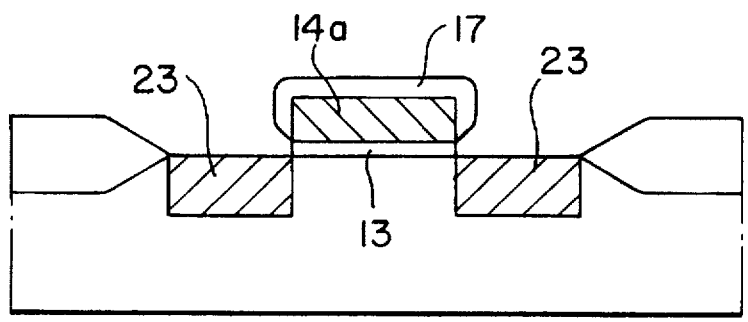

As shown in FIG. 5E, nitride film 23 is etched, leaving nitride film 23 only in recesses 16. An oxide film is formed by thermal oxidation on exposed surfaces of gate electrode 14a to prevent gate electrode from forming short circuits to a source and drain and to protect gate electrode 14a during subsequent etchings.

Figure 5F:
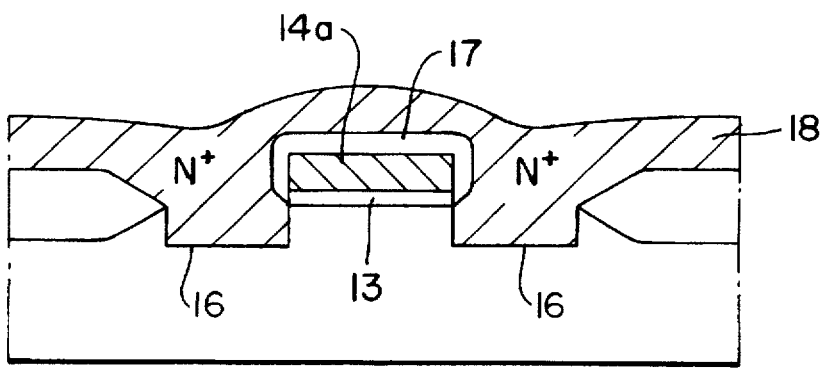

As shown in FIG. 5F, nitride film 23 is removed and then an in-situ doped polysilicon 18, such as n type polysilicon, 18 for forming a source and drain, is deposited over the entire silicon substrate 11. A thickness of in-situ doped polysilicon 18 is at least half the width of a recess 16.

Figure 5G:
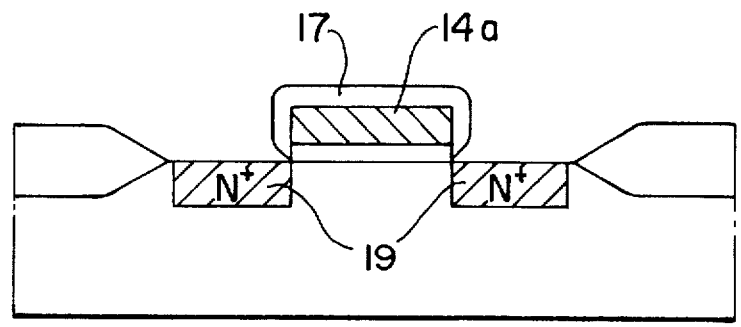

Next, as shown in FIG. 5G, the in-situ doped 18 is etched to form source and drain 19 buried in the the recesses 16

Figure 5H:
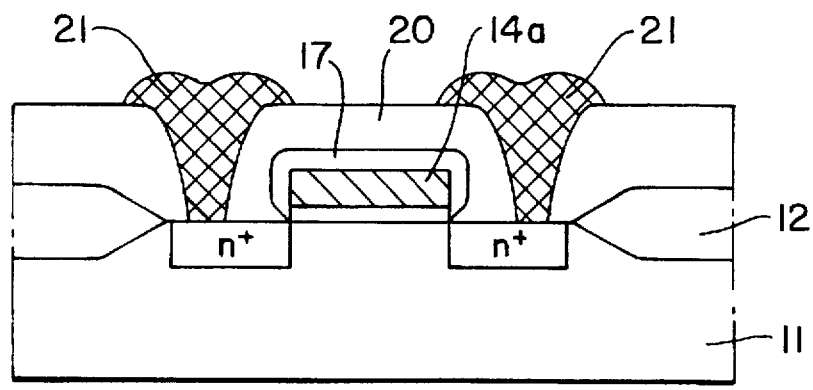

As shown in FIG. 5H an interlayer insulating film 20 of, for example, an LTO (Low Temperature Oxide) or BPSG (Borophospho-silicate glass), is formed, on silicon substrate 11. Contact holes which expose source and drain 19 are then formed by selective etching, deposited on interlayer. Metal layers 21, deposited on interlayer insulation film 20 and in the contact openings, are patterned.

Figure 5I:
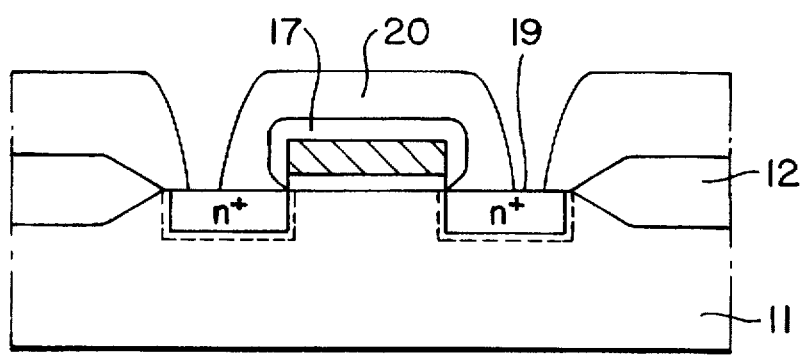

As shown in FIG. 5I. lightly doped regions 22 may be formed around source and drain 19 by heat treatment when impurities diffuse from the n type polysilicon of source and drain 19. Thus, an LDD structure which reduces hot carrier effects can be made without any additional LDD processes, such as forming side wall spacers, etc.

In this embodiment, n+ silicon is used for source and drain 19; however, the material for forming source and drain 19 can vary depending on channel density. For example, when the channel density is below $5.0\times10^{17}/cm^2$, n+ polysilicon or p+ polysilicon can be used, but when the channel density is over $5.0\times10^{17}/cm^2$, Al for nMOS, and W, Mo, Co, and Pt for pMOS can be used.

As has been explained, this invention forms sources and drains by etching a silicon substrate and burying conductive material into the etched parts, not by injecting ions. Therefore, this invention prevents reduction of channel length caused side diffusion, a problem of conventional art, and solves other consequential problems from side diffusion. Particularly, since side diffusion is avoided, element integration is improved.

Furthermore, by heat treating, an LDD structure is possible without any additional steps. And, since annealing for ion injection and subsequent diffusion are not used, predicting element characteristics and controlling fabrication processes becomes easy.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method for fabricating a semiconductor device comprising the steps of:

successively forming on a conductive silicon substrate, a gate insulating film and a conductive layer;

patterning the conductive layer and the gate insulating film with a gate pattern to form a gate;

etching portions of the silicon substrate on both sides of the gate to form recesses in the silicon substrate;

forming nitride films so as to fill the recesses;

forming an oxide film on all exposed surfaces of the gate by thermal oxidation;

removing the nitride films;

forming impurity doped conductive layers filling the recesses so as to form a source and drain.

2. The method as claimed in claim 1, wherein the impurity doped, conductive material layer is formed by depositing n+ polysilicon.

3. The method as claimed in claim 1, wherein the impurity doped conductive material layer is formed by depositing p+ polysilicon.

4. The method as claimed in claim 1, further comprising the step of heat treating the etched impurity doped conductive material layer to diffuse impurities from the etched impurity doped conductive material layer into the substrate to form low density impurity regions around the source and drain.

5. The method as claimed in claim 1, further comprising the steps of:

forming an interlayer insulation film on the substrate after etching the impurity doped conductive material layer;

selectively etching the interlayer insulation film to form contact openings exposing the source and drain; and depositing a metal layer on the interlayer insulation film including the contact openings.

* * * * *